United States Patent
Cohen et al.

(10) Patent No.: US 10,170,308 B1
(45) Date of Patent: Jan. 1, 2019

(54) FABRICATING SEMICONDUCTOR DEVICES BY CROSS-LINKING AND REMOVING PORTIONS OF DEPOSITED HSQ

(71) Applicant: International Business Machines Corporation, Armonk, NY (US)

(72) Inventors: Guy Cohen, Ossining, NY (US); Pouya Hashemi, White Plains, NY (US); Sanghoon Lee, Mohegan Lake, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/730,239

(22) Filed: Oct. 11, 2017

(51) Int. Cl.
*H01L 21/033* (2006.01)

(52) U.S. Cl.
CPC ...... *H01L 21/0332* (2013.01); *H01L 21/0335* (2013.01); *H01L 21/0337* (2013.01)

(58) Field of Classification Search
CPC ........... H01L 21/7682; H01L 21/76814; H01L 21/76825; H01L 21/3105; H01L 21/02216; H01L 21/02318; H01L 21/0337; H01L 21/32139; H01L 21/31144
See application file for complete search history.

(56) References Cited

U.S. PATENT DOCUMENTS

| | | | |
|---|---|---|---|
| 8,685,823 B2 | 4/2014 | Bangsaruntip et al. | |
| 2004/0084774 A1* | 5/2004 | Li | C08G 61/02 257/758 |
| 2005/0082089 A1* | 4/2005 | Grunow | H01L 21/76805 174/266 |
| 2008/0145795 A1* | 6/2008 | Yudhistira | G03F 7/0035 430/313 |
| 2009/0246538 A1* | 10/2009 | Yamamoto | C23C 16/401 428/446 |

OTHER PUBLICATIONS

Y. Ekinci et al., "20 nm Line/Space Patterns in HSQ Fabricated by EUV Interference Lithography," MicroElectronic Engineering, May-Aug. 2007, pp. 700-704, vol. 84, Nos. 5-8.
A. Langner et al., "Evaluation of Resist Performance for 22nm Half-Pitch and Beyond Using EUV Interference Lithography," International Symposium on Extreme Ultraviolet Lithography, Oct. 17-20, 2010, 1 page, vol. 3.
Y. Ekinci et al., "Evaluation of EUV Resist Performance with Interference Lithography in the Range of 22-7 nm HP," Proceedings of SPIE, 2004, 18 pages.

* cited by examiner

*Primary Examiner* — Caridad Everhart
(74) *Attorney, Agent, or Firm* — L. Jeffrey Kelly; Ryan, Mason & Lewis, LLP

(57) ABSTRACT

A method of manufacturing a semiconductor device comprises forming a hydrogen silesquioxane (HSQ) layer on a semiconductor substrate, forming a cap layer on the HSQ layer, cross-linking a portion of the HSQ layer under the cap layer, and removing another portion of the HSQ layer which was not cross-linked.

9 Claims, 12 Drawing Sheets

300

300

300

300

FABRICATING SEMICONDUCTOR DEVICES BY CROSS-LINKING AND REMOVING PORTIONS OF DEPOSITED HSQ

BACKGROUND

Hydrogen silesquioxane (HSQ) is an inorganic compound having the chemical formula $[HSiO_{3/2}]_n$. An example HSQ includes the cubic cluster $H_8Si_8O_{12}$. HSQ can be used as a resist in optical lithography (e.g., extreme ultraviolet (EUV) and electron-beam (e.g., e-beam) lithography) to achieve fine resolution. For example, HSQ is sensitive to e-beam or EUV lithography, which is used for advanced nodes. HSQ can also be used as a material for dummy gates in a replacement gate flow to fabricate metal oxide semiconductor field-effect transistors (MOSFETs).

A MOSFET is a type of field-effect transistor (FET) that has an insulated gate, the voltage of which determines a conductivity of the device. A MOSFET's ability to change conductivity based on the amount of applied voltage is utilized for amplifying or switching electronic signals.

SUMMARY

According to an exemplary embodiment of the present invention, a method of manufacturing a semiconductor device comprises forming a hydrogen silesquioxane (HSQ) layer on a semiconductor substrate, forming a cap layer on the HSQ layer, cross-linking a portion of the HSQ layer under the cap layer, and removing another portion of the HSQ layer which was not cross-linked.

According to an exemplary embodiment of the present invention, a method of manufacturing a semiconductor device comprises forming a cap layer on a hydrogen silesquioxane (HSQ) layer; cross-linking a portion of the HSQ layer under the cap layer; and removing another portion of the HSQ layer which was not cross-linked.

According to an exemplary embodiment of the present invention, a method of manufacturing a semiconductor device comprises forming a hydrogen silesquioxane (HSQ) layer on a semiconductor substrate; forming a cap layer on the HSQ layer; performing a lithography process to cross-link a portion of the HSQ layer under the cap layer; and exposing another portion of the HSQ layer which was not cross-linked to a developer to remove the other portion of the HSQ layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
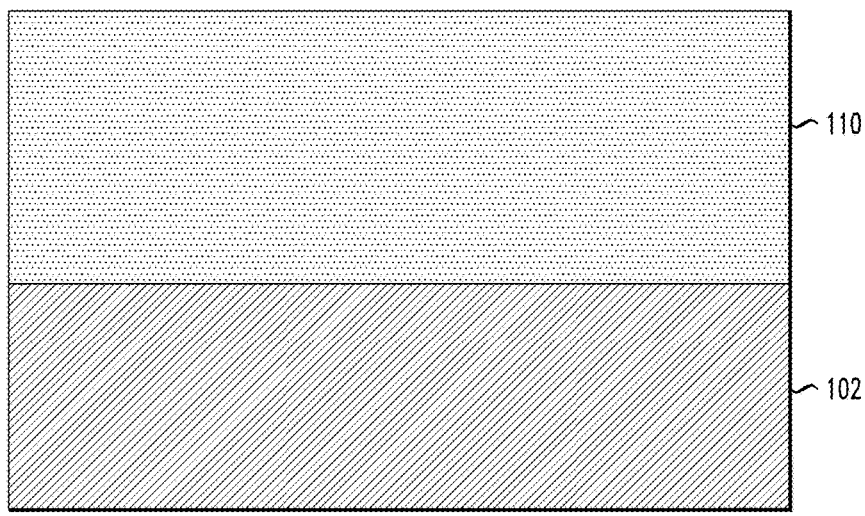
FIG. 1 is a schematic cross-sectional view illustrating manufacturing of a transistor device and showing formation of a first HSQ layer on a substrate, according to an embodiment of the invention.

In illustrative embodiments, techniques are provided for using certain properties of HSQ during semiconductor manufacturing. More particularly, illustrative embodiments provide techniques for cross-linking portions of deposited HSQ and removing the portions of the HSQ that are not cross-linked to form various semiconductor structures. As will be explained in illustrative embodiments, such fabrication techniques are advantageous over conventional fabrication techniques.

It is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount.

In the figures, the illustrated scale of one layer, structure, and/or region relative to another layer, structure, and/or region is not necessarily intended to represent actual scale. One or more layers and/or regions of a type commonly used in, for example, a FET, a MOSFET, a complementary metal-oxide semiconductor (CMOS), nanowire FET, fin field-effect transistor (FinFET), vertical FET (VFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, MOSFETs, VFETs, nanowire FETs, CMOSs and/or FinFETs. By way of non-limiting example, the semiconductor devices can include, but are not limited to FET, MOSFET, VFET, nanowire FET, CMOS and FinFET devices, and/or semiconductor devices that use FET, MOSFET, VFET, nanowire FET, CMOS and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As noted above, embodiments of the present invention provide techniques to form various semiconductor structures which cross-link portions of deposited HSQ layers and then remove portions of the HSQ layers that are not cross-linked. For example, in accordance with an embodiment of the present invention, through-hard mask-lithography is used to form a self-aligned hard mask on cross-linked HSQ patterns defined by the lithography, not by etching. Portions of the HSQ layers that are not cross-linked can be removed by a development process using tetramethylammonium hydroxide (TMAH). The HSQ patterns are used as dummy patterns in a replacement metal gate (RMG) process, and can be removed using dilute hydrofluoric acid (DHF).

According to an embodiment of the present invention, the cross-linking and development properties of HSQ can further be used to create a vacant area over a dielectric. The vacant area includes side and top borders to permit epitaxial growth of a III-V semiconductor, such as, but not necessarily limited to Indium phosphide (InP), on the dielectric layer from a portion of a semiconductor substrate underlying the dielectric layer.

According to an embodiment of the present invention, the cross-linking and development properties of HSQ can further be used to form HSQ spacers on, for example, a gate structure. The HSQ spacers can be formed without using an etching process, such as, for example, reactive ion etching (RIE), and instead using lithography and development processes.

FIG. 1 is a schematic cross-sectional view illustrating manufacturing of a transistor device and showing formation of a first HSQ layer on a substrate, according to an embodiment of the invention. Referring to FIG. 1, a first HSQ layer 110 is spin-coated onto a semiconductor substrate 102. In accordance with an embodiment of the present invention, a thickness (e.g., vertical height with respect to the substrate 102) of the HSQ layer 110 is about 50 nm to about 200 nm. The thickness can be adjusted based on spin speed of the wafer (e.g., about 500 RPM to 5000 RPM) during the spin coating process, and a dilution (e.g., about 1% to about 6%) of the HSQ. For example a preferred spin coat performed at 3000 RPM with a dilution of 6% at room temperature would form a 120 nm HSQ layer. If the HSQ is more dilute (e.g., 1% as opposed to 6%), a resulting thickness of the HSQ layer will be less (e.g., about 30 nm for 1% dilution) at the same spin speed.

The semiconductor substrate 102 includes semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate. The semiconductor substrate 102 can be a bulk substrate or a silicon-on-insulator (SOI) substrate including a buried insulating layer, such as, for example, a buried oxide or nitride layer.

Figure 2:
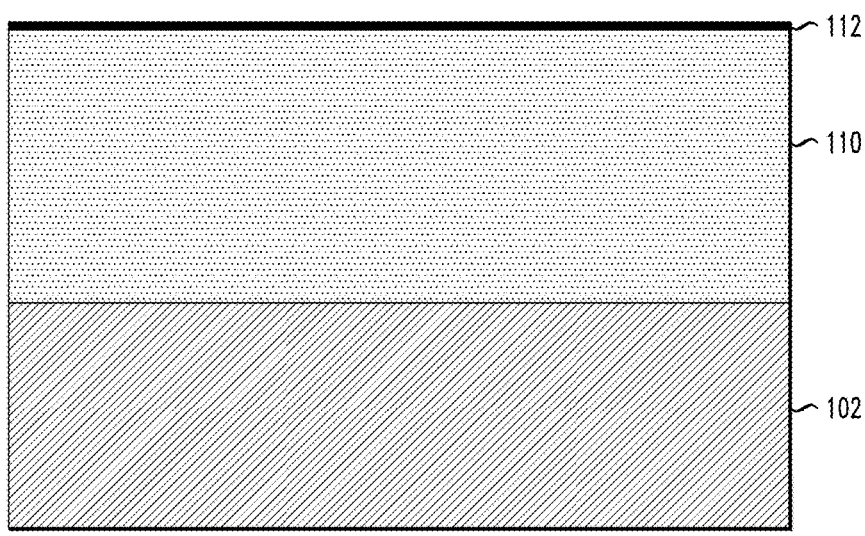
FIG. 2 is a schematic cross-sectional view illustrating manufacturing of a transistor device and showing deposition of a thin protective layer, according to an embodiment of the invention.

FIG. 2 is a schematic cross-sectional view illustrating manufacturing of a transistor device and showing deposition of a thin protective layer, according to an embodiment of the invention. Referring to FIG. 2, the protective layer 112 is deposited on the first HSQ layer 110, and can include, but is not necessarily limited to, aluminum oxide ($Al_2O_3$), hafnium oxide ($HfO_2$), and zirconium oxide ($ZrO_2$). The protective layer 112 is thin or ultra-thin, having a thickness, (e.g. vertical height with respect to the HSQ layer 110) of about 3 nm to about 10 nm. The protective layer 112 is deposited at very low temperature, for example, less than about 200° C., such as, but not necessarily limited to, 100° C. or 150° C., so that the chemical properties of the HSQ layer 110 are not changed during the deposition process. For example, the very low temperature at which the protective layer 112 is deposited is less than the threshold temperature for cross-linking the HSQ layer 110 so as to prevent cross-linking of the HSQ layer 110, so that the HSQ layer 110 remains sensitive to subsequent lithography processes (e.g., e-beam or EUV), which cross-link the HSQ. The protective layer 112 protects the first HSQ layer 110 from plasma, which may be used during subsequent etching processes, such as reactive ion etching (RIE). The protective layer 112 is deposited using deposition techniques, including but not necessarily limited to, atomic layer deposition (ALD), evaporation, and sputtering (physical vapor deposition (PVD)). According to another embodiment, the protective layer 112 may be omitted.

Figure 3:
FIG. 3 is a schematic cross-sectional view illustrating manufacturing of a transistor device and showing deposition of a dielectric mask layer, according to an embodiment of the invention.

FIG. 3 is a schematic cross-sectional view illustrating manufacturing of a transistor device and showing deposition of a dielectric mask layer, according to an embodiment of the invention. Referring to FIG. 3, a dielectric hard mask layer 114 (may also be referred to as a cap layer) including, but not necessarily limited to a low-temperature oxide or nitride, for example, $SiO_2$, and $Si_3N_4$, spin-on glass (SOG), or silicon anti-reflective coating (SiARC) is deposited or coated on the protective layer 112. The properties of SiARC can be useful for lithography. Like the protective layer 112, in order to preserve the properties of the HSQ layer, the dielectric mask layer 114 is deposited at a very low temperature, such as, for example, less than 200° C., including, but not necessarily limited to, room temperature, 100° C. or 150° C. The dielectric hard mask layer 114 is deposited using deposition techniques, including but not necessarily limited to, atomic layer deposition (ALD), evaporation, sputtering (PVD), or spin-coating.

Figure 4:
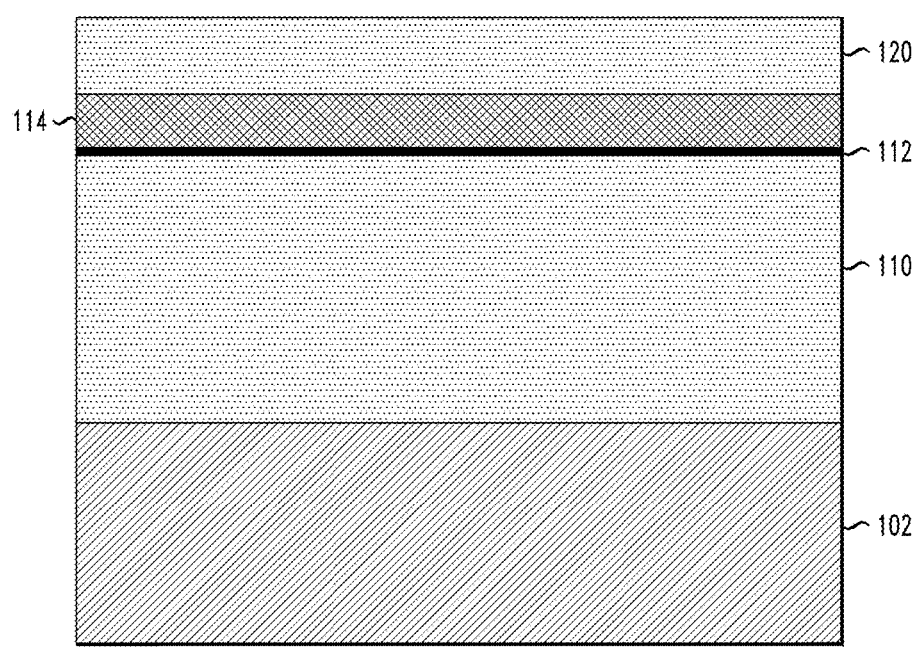
FIG. 4 is a schematic cross-sectional view illustrating manufacturing of a transistor device and showing formation of a second HSQ layer, according to an embodiment of the invention.

FIG. 4 is a schematic cross-sectional view illustrating manufacturing of a transistor device and showing formation of a second HSQ layer, according to an embodiment of the invention. Referring to FIG. 4, a second HSQ layer 120 is spin-coated onto the dielectric mask layer 114. In accordance with an embodiment of the present invention, a thickness (e.g., vertical height with respect to the dielectric mask layer 114) of the HSQ layer 120 is about 30 nm to about 50 nm. Like the first HSQ layer, the thickness can be adjusted based on spin speed of the wafer (e.g., about 3000 RPM to 5000 RPM) during the spin coating process, and a dilution (e.g., about 1% to about 6%) of the HSQ. A preferred spin coat may be performed at 3000 RPM with a dilution of 1% at room temperature.

The dielectric mask layer 114 and/or the protective layer 112 prevent the solvent from the second HSQ layer 120 from entering the first HSQ layer 110. In doing so, the dielectric mask layer 114 and/or the protective layer 112 act as a barrier to maintain the first and second HSQ layers 110 and 120 as two distinct layers. Otherwise, if the layers 110 and 120 were deposited directly on top of each other, due to the solvent from the second HSQ layer 120 entering the first HSQ layer 110, the layers 110 and 120 could not be distinguished as separate layers from each other. There needs to be at least one of the layers 112 and 114 between the first and second HSQ layers 110 and 120 to prevent the second HSQ layer 120 from dissolving the first HSQ layer 110.

Figure 5:
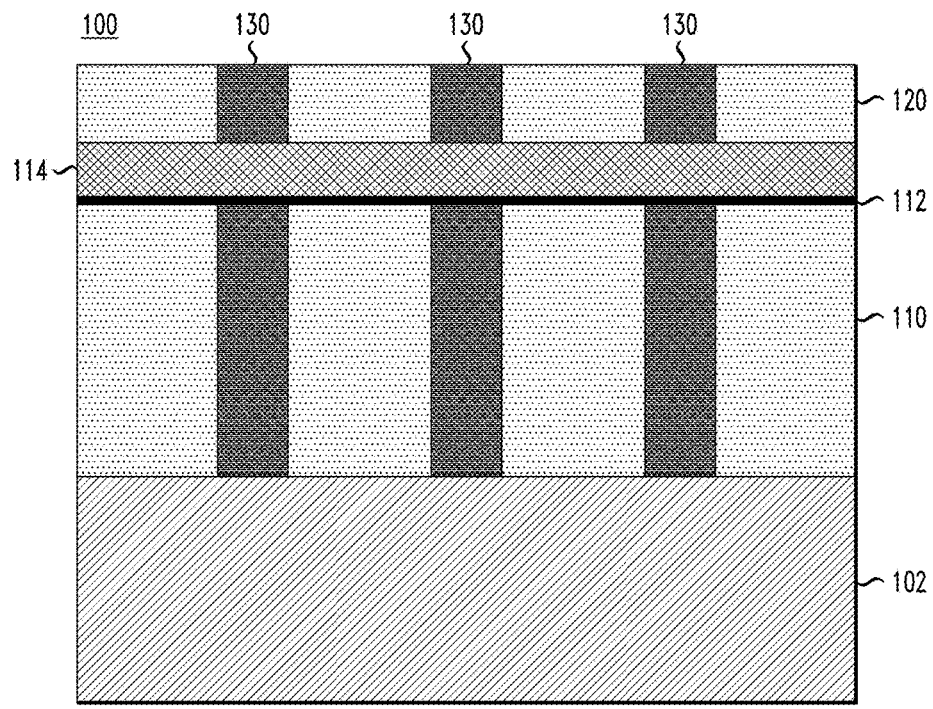
FIG. 5 is a schematic cross-sectional view illustrating manufacturing of a transistor device and showing results of exposure to crosslink aligned portions of the first and second HSQ layers, according to an embodiment of the invention.

FIG. 5 is a schematic cross-sectional view illustrating manufacturing of a transistor device and showing results of exposure to crosslink aligned portions of the first and second HSQ layers, according to an embodiment of the invention. Referring to FIG. 5, portions of the first and second HSQ layers 110 and 120 are exposed using lithography, including but not necessarily limited to, optical lithography, such as, but not necessarily limited to, EUV lithography, which uses photons, or e-beam lithography, which uses electrons, to cross-link the exposed portions of the first and second HSQ layers 110 and 120. For example, if optical lithography is used, parts of the first and second HSQ layers 110, 120 can be masked using an optical mask, and exposed portions of first and second HSQ layers 110, 120 are cross-linked to result in the cross-linked portions 130. If e-beam lithography is used, a mask is not necessary, and the e-beam can be directed to specific coordinates corresponding to the desired locations of the first and second HSQ layers 110, 120 to be cross-linked to result in the cross-linked portions 130. The electrons in an e-beam can have an energy of, for example, about 100 Kev. As can be seen in FIG. 5, the exposure, whether optical or e-beam, is able to pass through the dielectric mask and protective layers 114, 112 so that the first and second HSQ layers 110, 120 are exposed in a single exposure step and the cross-linked portions 130 of the first and second HSQ layers 110, 120 that are formed are perfectly aligned with each other. For example, in the optical and e-beam exposure, the photons and electrons, respectively, penetrate through the stack to the first HSQ layer 110, not just to the second HSQ layer 120 in a single exposure. FIGS. 1-14 show a case of a planar transistor. However, the same methods, in accordance with embodiments of the present invention, can be applied to a nanowire transistor or a nano-sheet transistor where the first HSQ layer 110 will fill above and under the nanowires (or nano-sheets) and the exposure is able to pass through the dielectric mask and protective layers 114, 112, as well as the nanowires (or nano-sheets).

Figure 6:
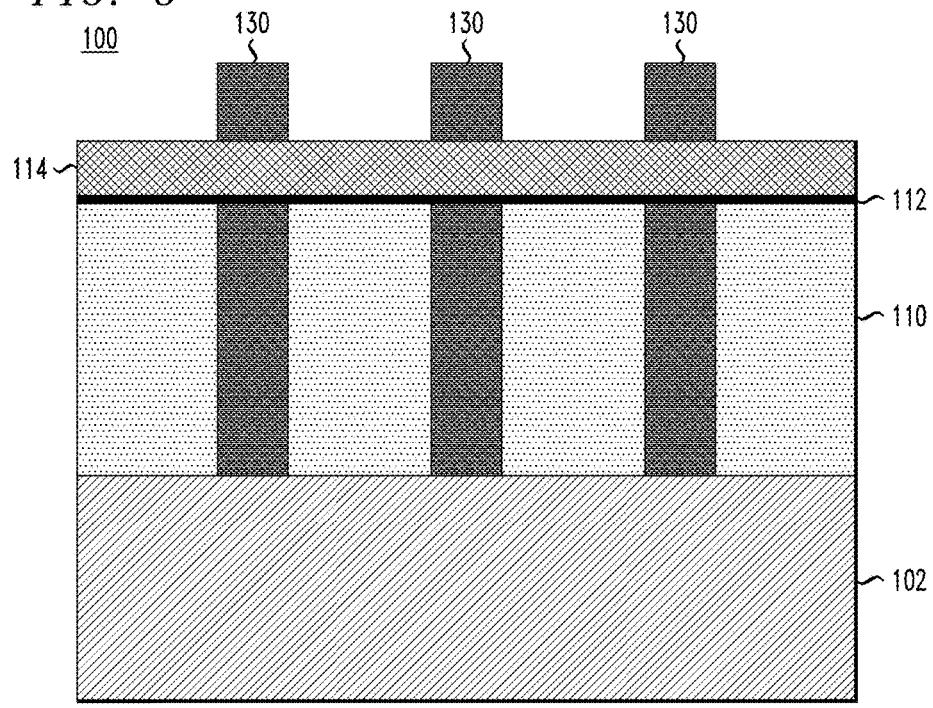
FIG. 6 is a schematic cross-sectional view illustrating manufacturing of a transistor device and showing developing of portions of the second HSQ layer to remove those portions of the second HSQ layer, according to an embodiment of the invention.

FIG. 6 is a schematic cross-sectional view illustrating manufacturing of a transistor device and showing developing of portions of the second HSQ layer to remove those portions of the second HSQ layer, according to an embodiment of the invention. Referring to FIG. 6, the portions of the second HSQ layer 120 that have not been cross-linked are developed by a developer including, but not necessarily limited to, a TMAH based solution, or an NaCl+TMAH based solution, which removes the portions of the second HSQ layer 120 that have not been cross-linked, and the cross-linked portions 130 remain. The dielectric mask layer 114 and the protective layer 112 prevent the developer from accessing the first HSQ layer 110.

Figure 7:
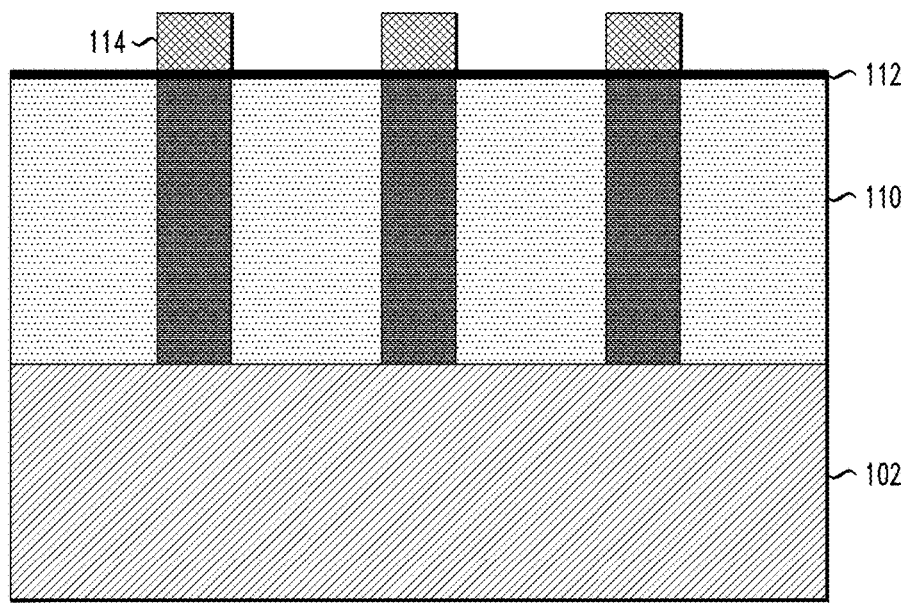
FIG. 7 is a schematic cross-sectional view illustrating manufacturing of a transistor device and showing removal of the remaining second HSQ layer and exposed portions of the dielectric mask layer, according to an embodiment of the invention.

FIG. 7 is a schematic cross-sectional view illustrating manufacturing of a transistor device and showing removal of the remaining second HSQ layer and exposed portions of the dielectric mask layer, according to an embodiment of the invention. Referring to FIG. 7, the cross-linked portions 130 of the second HSQ layer and exposed portions of the dielectric mask layer 114 are removed down to the protective layer 112 using an etching process, such as, for example, ME. Alternatively, the protective layer 112 may also be removed during this etching. Etching can be performed using, for example, when $Si_3N_4$ is used for layer 114, a $CF_4$ based RIE to pattern the film, and if $Al_2O_3$ is used for layer 112, a $BCl_3$ RIE chemistry can be applied for etching. As can be seen, in this case, the cross-linked portions 130 of the second HSQ layer act as a mask for the non-exposed portions of the dielectric mask layer 114. Depending on the embodiment, during the etching, the cross-linked portions 130 of the second HSQ layer can be partially or fully (as shown) consumed.

Figure 8:
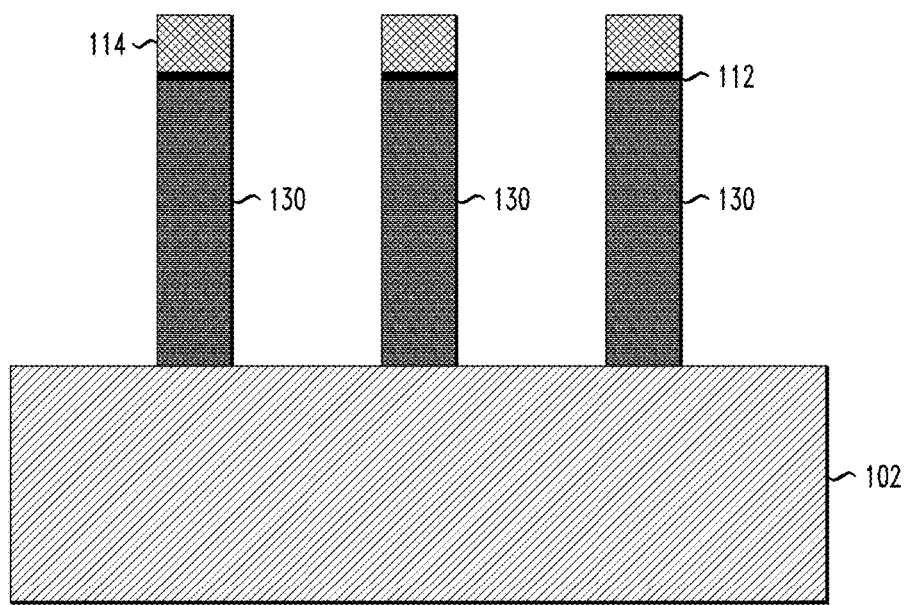
FIG. 8 is a schematic cross-sectional view illustrating manufacturing of a transistor device and showing developing of portions of the first HSQ layer to remove those portions of the first HSQ layer, according to an embodiment of the invention.

FIG. 8 is a schematic cross-sectional view illustrating manufacturing of a transistor device and showing developing of portions of the first HSQ layer to remove those portions of the first HSQ layer, according to an embodiment of the invention. Referring to FIG. 8, the portions of the first HSQ layer 110 that have not been cross-linked are developed by a developer including, but not necessarily limited to, a TMAH based solution, or an NaCl+TMAH based solution, which removes the portions of the first HSQ layer 110 that have not been cross-linked, and the cross-linked portions 130 remain. The developer dissolves the non-cross-linked portions 110, but does not dissolve the cross-linked portions 130. The developer can also remove the exposed portions of the protective layer 112 (e.g., in the case of an $Al_2O_3$ protective layer) that are not covered by the dielectric mask layer 114. Alternatively, removal of the exposed portions of the protective layer 112 can be performed by, for example, etching, prior to the development process. The dielectric mask layer 114 and the protective layer 112 remain on the cross-linked portions 130 that have not been dissolved by the developer. As can be seen in FIG. 8, the resulting structure includes a self-aligned hard mask (layer 114) on straight and relatively tall HSQ patterns 130.

Figure 9:
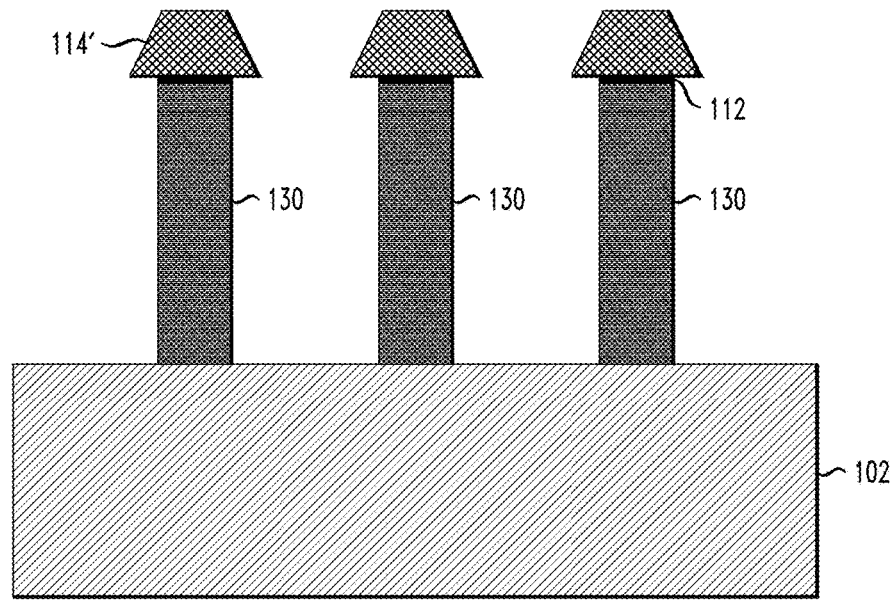
FIG. 9 is a schematic cross-sectional view illustrating manufacturing of a transistor device and showing developing of portions of the first HSQ layer if the removal of the exposed portions of the dielectric mask layer described in connection with FIG. 7 was tapered, according to an embodiment of the invention.
Figure 10:
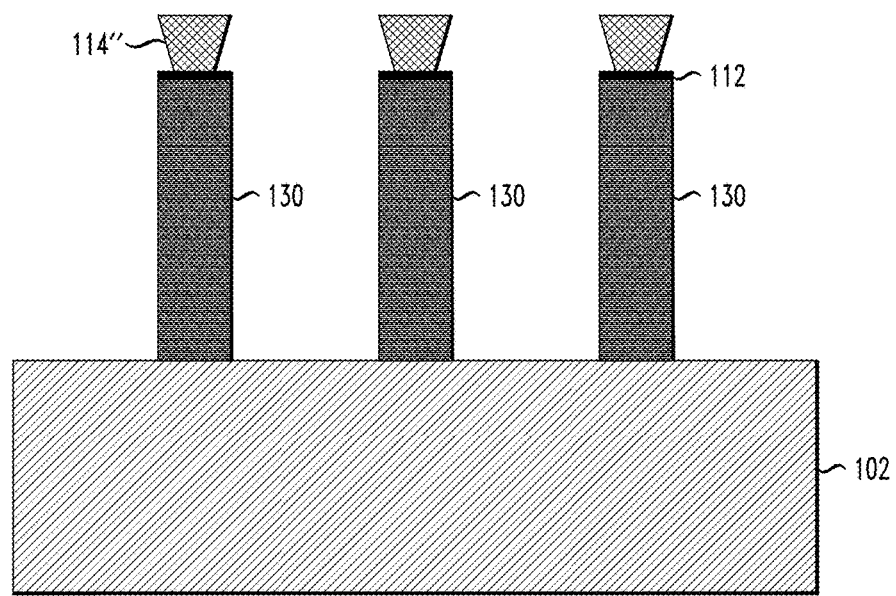
FIG. 10 is a schematic cross-sectional view illustrating manufacturing of a transistor device and showing developing of portions of the first HSQ layer if the removal of the exposed portions of the dielectric mask layer described in connection with FIG. 7 was notched, according to an embodiment of the invention.

FIGS. 9 and 10 are schematic cross-sectional views illustrating manufacturing of a transistor device and showing developing of portions of the first HSQ layer if the removal of the exposed portions of the dielectric mask layer described in connection with FIG. 7 was tapered or notched, respectively, according to embodiments of the invention. The amount of tapering or notching shown in FIGS. 9 and 10 may be exaggerated for clarity. Referring to FIG. 9, if the etching, for example, ME, is tapered, the hard mask 114' has a trapezoidal shape which laterally progressively extends beyond a horizontal width of the patterns 130. Referring to FIG. 10, if the etching, for example, ME, is notched, the hard mask 114" has a trapezoidal shape which laterally progressively decreases to less than a horizontal width of the patterns 130. Regardless of the shape of the dielectric hard mask layer 114, the HSQ patterns' 130 width is independent of the hard mask broadening or narrowing and the HSQ patterns 130 remain straight and relatively tall.

Figure 11:
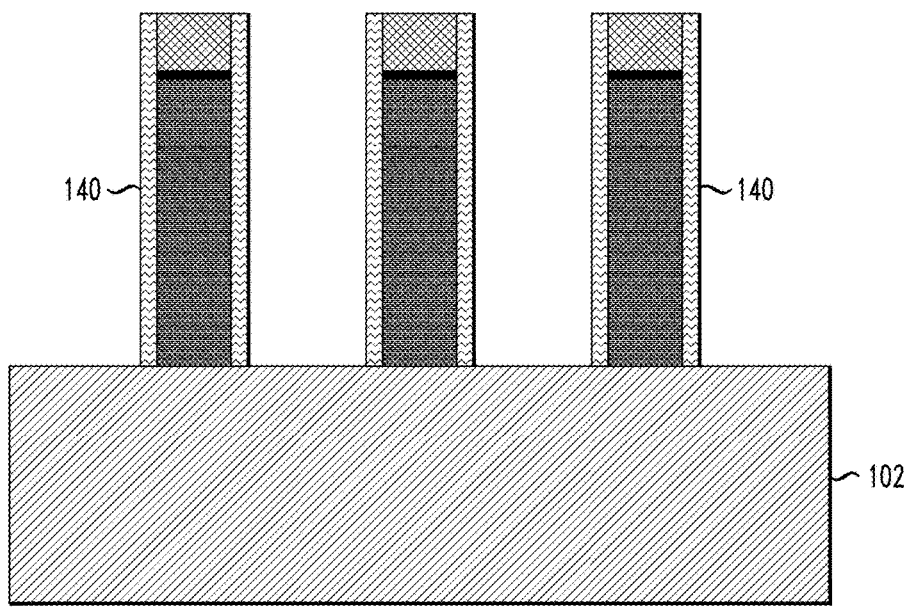
FIG. 11 is a schematic cross-sectional view illustrating manufacturing of a transistor device and showing spacer formation, according to an embodiment of the invention.

FIG. 11 is a schematic cross-sectional view illustrating manufacturing of a transistor device and showing spacer formation, according to an embodiment of the invention. Referring to FIG. 11, which follows from FIG. 8, a conformal deposition process, such as, for example, ALD or molecular layer deposition (MLD), can be used to deposit a conformal layer on the substrate 102, and on and around the stacked structures including the cross-linked patterns 130 and the hard mask and protective layers 114 and 112 on the cross-linked patterns 130. The conformal layer can include, but is not necessarily limited to, siliconborocarbonitride (SiBCN), silicon oxycarbonitride (SiOCN), SiN or $SiO_2$. The horizontal portions of the conformal layer on the substrate 102, and on the top surfaces of hard mask layers 114, are etched back to form spacers 140. The etch can be, for example, an anisotropic etch, such as RIE.

Figure 12:
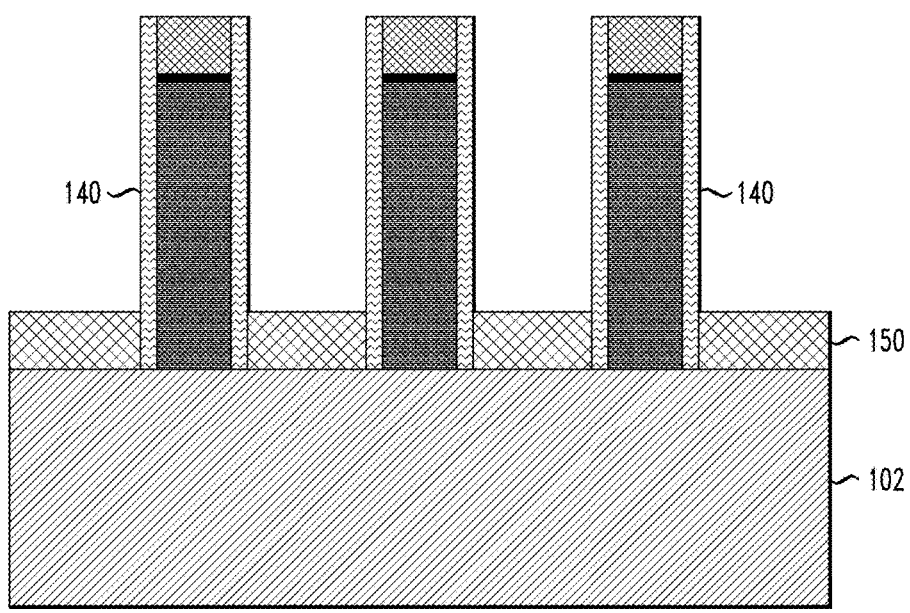
FIG. 12 is a schematic cross-sectional view illustrating manufacturing of a transistor device and showing formation of source/drain epitaxial regions, according to an embodiment of the invention.

FIG. 12 is a schematic cross-sectional view illustrating manufacturing of a transistor device and showing formation of source/drain epitaxial regions, according to an embodiment of the invention. Referring to FIG. 12, source/drain regions 150 including, for example, epitaxially grown silicon (Si), silicon germanium (SiGe) or other semiconductor material, are formed by selective epitaxy on the substrate 102 between the HSQ patterns 130 including the spacers 140 thereon. The source/drain epitaxial regions 150 can be doped by, for example, ion implantation, in situ or other doping processes.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

By "in-situ" it is meant that the dopant that dictates the conductivity type of the doped layer is introduced during the process step, e.g., epitaxial deposition, that forms the doped layer. The term "selective epitaxy" means that the deposition process occurs over a semiconductor surface such as substrate 102, but no material is deposited over dielectric surfaces such as spacers 140 and hard mask 114.

Figure 13:
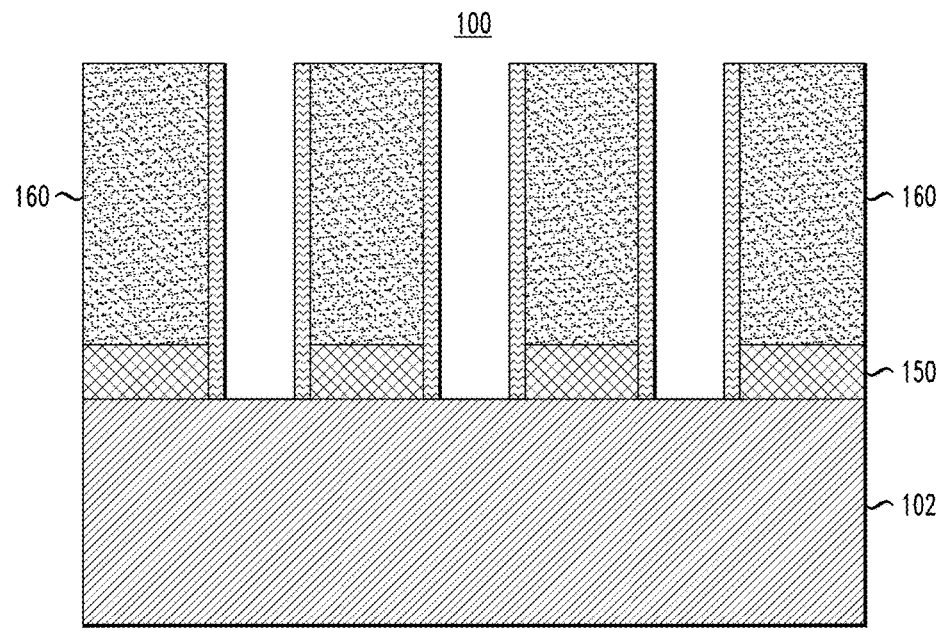
FIG. 13 is a schematic cross-sectional view illustrating manufacturing of a transistor device and showing formation of an inter-layer dielectric (ILD) layer and removal of the remaining dielectric mask and cross-linked HSQ patterns, according to an embodiment of the invention.

FIG. 13 is a schematic cross-sectional view illustrating manufacturing of a transistor device and showing formation of an inter-layer dielectric (ILD) layer and removal of the remaining dielectric mask and cross-linked HSQ patterns, according to an embodiment of the invention. Referring to FIG. 13, an ILD layer 160, such as, for example, a nitride or other dielectric material, is deposited on the source/drain regions 150 between the HSQ patterns 130 including the spacers 140 thereon. The cross-linked HSQ patterns 130, which function as dummy gates for a replacement metal gate (RMG) process, are removed from in-between the spacers 140 along with the dielectric hard mask and protective layers 114 and 112. The removal of the HSQ patterns 130 can be performed with DHF, which can dissolve the HSQ patterns 130. While DHF is preferred to etch the HSQ 130 patterns, RIE can also be used to selectively etch HSQ patterns 130 with respect to ILD layer 160. For example, $CF_4/CHF_3$ chemistry may be used to etch the HSQ patterns 130, but the selectivity with regard to ILD layer 160 is typically not as high as that obtained by DHF. The dielectric hard mask and protective layers 114 and 112 can be removed using a planarization process, such as chemical mechanical planarization (CMP). For example, according to a non-limiting illustrative example, the ILD layer 160 and the dielectric hard mask layer 114 can both include a nitride, for example $Si_3N_4$. CMP is used to planarize the structure and remove the excess ILD layer 160 that was deposited above the hard mask 114, and the hard mask 114. In accordance with an embodiment of the present invention, the CMP can be used to remove both hard mask 114 and protective layer 112, such that the CMP process stops on the HSQ patterns 130. If the CMP process is selective with respect to the protective layer 112, the CMP will stop on layer 112. In that case, there may be a need to change the slurry used for the CMP to further remove layer 112 by CMP. Alternatively, layer 112 can be removed by a wet etch. After removal of the layers 114 and 112, the top surface of the ILD layer 160 is leveled (flashed) with the top surfaces of HSQ patterns 130. Then, referring to FIG. 13, the exposed HSQ patterns 130 are selectively etched with respect to the ILD layer 160 and spacers 140 using DHF.

Figure 14:
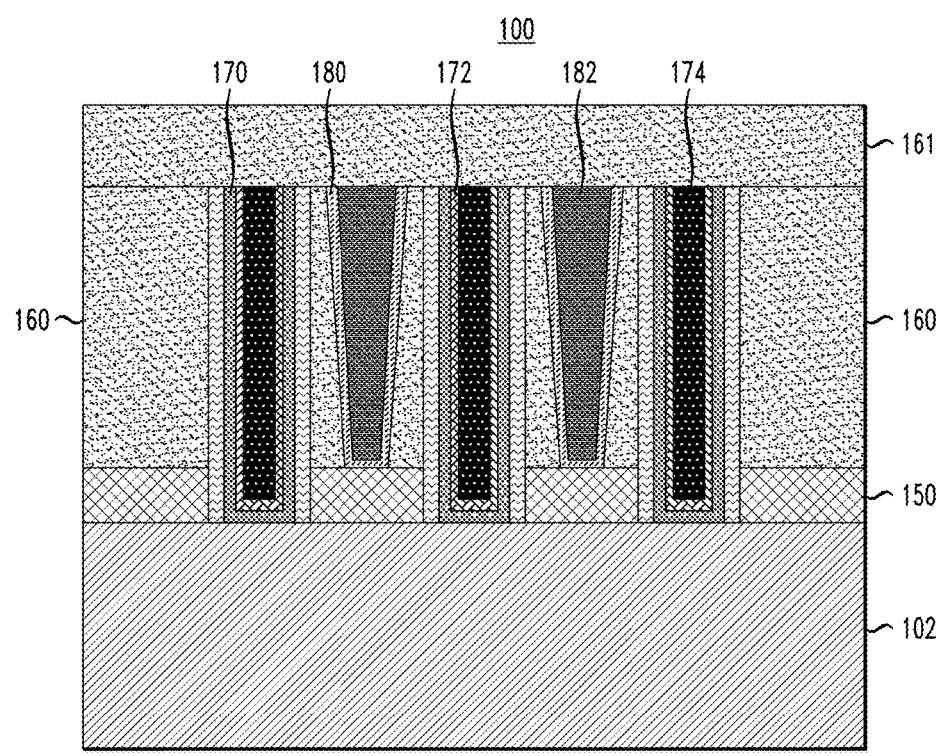
FIG. 14 is a schematic cross-sectional view illustrating manufacturing of a transistor device and showing formation of gate structures, source/drain contacts and an additional inter-layer dielectric (ILD) layer, according to an embodiment of the invention.

FIG. 14 is a schematic cross-sectional view illustrating manufacturing of a transistor device and showing formation of gate structures, source/drain contacts and an additional inter-layer dielectric (ILD) layer, according to an embodiment of the invention. Referring to FIG. 14, the RMG processing can include, for example, deposition of a gate dielectric layer 170 such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structure includes a work-function metal (WFM) layer 172, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer 170. The gate structure can further include a gate layer 174 including, but not necessarily limited to, amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer 172 and the gate dielectric layer 170.

The source/drain contacts can be formed by etching trenches through the ILD layer 160, to reach the source/drain regions 150, and then filling the trenches with a contact material 182, such as, for example, electrically conductive material including, but not necessarily limited to, tungsten, cobalt, zirconium, tantalum, titanium, aluminum, ruthenium, and/or copper. A liner layer 180 including, but not necessarily limited to, a silicide/germanide, tantalum nitride, titanium nitride or ruthenium oxide, may be formed in the trenches before filling a remaining portion of the trenches with electrically conductive material 182.

Excess materials from the gate and contact structures formed above the top surface of the ILD layer 160 can be removed utilizing a planarization process, such as chemical mechanical planarization (CMP). Another ILD layer 161 such as, for example, a nitride or other dielectric material, can be deposited after formation of the gate and contact structures.

As noted above, in accordance with an embodiment of the present invention, the cross-linking and development properties of HSQ can be used to create a vacant area, which is formed over a dielectric and includes side and top borders to permit selective epitaxial growth of a semiconductor, such as a III-V semiconductor, on the dielectric layer from a portion of a semiconductor substrate underlying the dielectric layer.

Figure 15:
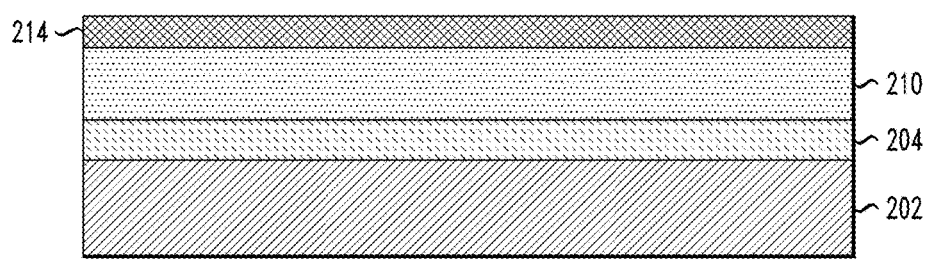
FIG. 15 is a schematic cross-sectional view illustrating manufacturing of a semiconductor device including a III-V semiconductor material on a dielectric layer and showing deposition of a very low temperature cap (VLTC) layer on an HSQ layer, according to an embodiment of the invention.

FIG. 15 is a schematic cross-sectional view illustrating manufacturing of a semiconductor device including a III-V semiconductor material on a dielectric layer and showing deposition of a very low temperature cap (VLTC) layer on an HSQ layer, according to an embodiment of the invention. Referring to FIG. 15, a dielectric layer 204 including, but not necessarily limited to $SiO_2$, is formed on a semiconductor substrate 202, such as silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs or InP), II-V compound semiconductor or other like semiconductor.

An HSQ layer 210 is formed on the dielectric layer 204. Similar to the HSQ layer 110 discussed herein above, the HSQ layer can be spin-coated onto the underlying layer. As will be explained further herein below a vertical thickness of the HSQ layer 210 controls a thickness of the resulting III-V semiconductor material.

A VLTC layer 214 is deposited on the HSQ layer 210, and can include, but is not necessarily limited to, aluminum oxide ($Al_2O_3$), hafnium oxide ($HfO_2$), and zirconium oxide ($ZrO_2$), like the protective layer 112 discussed herein above, and/or like the hard mask layer 114 discussed herein above, a low-temperature oxide or nitride, for example, $Si_3N_4$, spin-on glass (SOG), or silicon anti-reflective coating (SiARC). The VLTC layer 214 is deposited at very low temperature, for example, less than about 200° C., such as, but not necessarily limited to, room temperature, 100° C. or 150° C., so that the chemical properties of the HSQ layer 210 are not changed during the deposition process. The low temperature at which the VLTC layer 214 is deposited is less than the threshold temperature for cross-linking the HSQ layer 210 so as to prevent cross-linking of the HSQ layer 210, so that the HSQ layer 210 remains sensitive to subsequent lithography processes (e.g., e-beam or EUV), which cross-link the HSQ. The VLTC layer 214 is deposited using deposition techniques, including but not necessarily limited to, atomic layer deposition (ALD), evaporation, physical vapor deposition (PVD), or spin coating.

Figure 16:
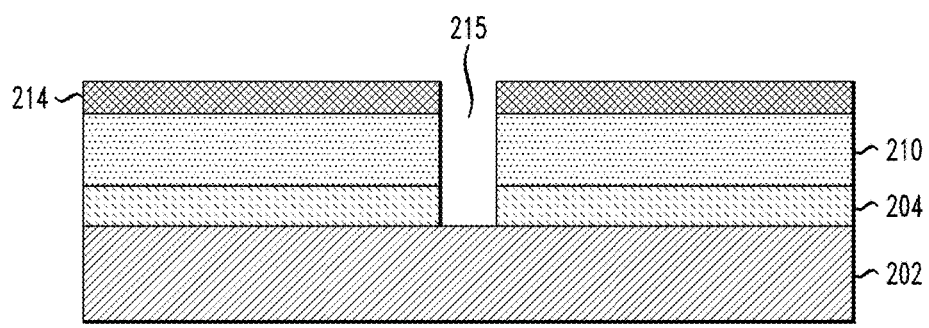
FIG. 16 is a schematic cross-sectional view illustrating manufacturing of a semiconductor device including a III-V semiconductor material on a dielectric layer and showing removal of VLTC, HSQ and dielectric layers to form a via exposing the semiconductor substrate, according to an embodiment of the invention.

FIG. 16 is a schematic cross-sectional view illustrating manufacturing of a semiconductor device including a III-V semiconductor material on a dielectric layer and showing removal of VLTC, HSQ and dielectric layers to form a via exposing the semiconductor substrate, according to an embodiment of the invention. Referring to FIG. 16, an etching process, such as, for example ME, is used to form a via 215 that exposes a portion of the substrate 202. Depending on a desired size and shape of the resulting III-V semiconductor layer, a larger and/or more than one via may be opened.

Figure 17A:
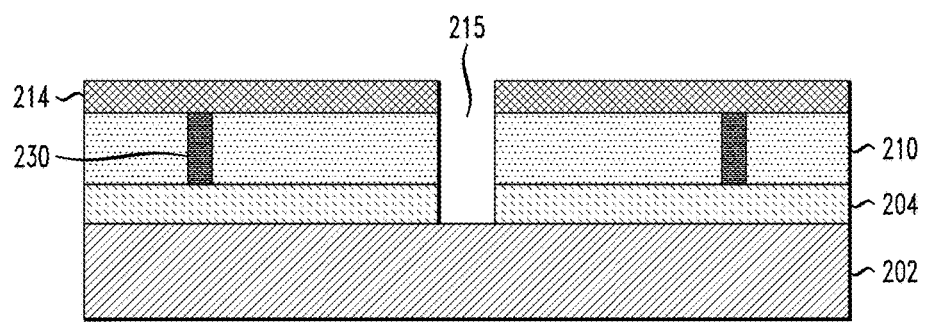
FIGS. 17A and 17B are schematic cross-sectional and top-down views, respectively, illustrating manufacturing of a semiconductor device including a III-V semiconductor material on a dielectric layer and showing results of exposure to crosslink aligned portions of the HSQ layer, according to an embodiment of the invention.
Figure 17B:
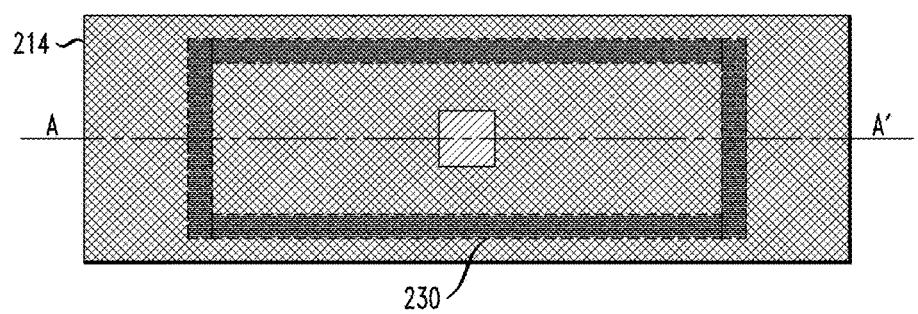

FIGS. 17A and 17B are schematic cross-sectional and top-down views, respectively, illustrating manufacturing of a semiconductor device including a III-V semiconductor material on a dielectric layer and showing results of exposure to crosslink aligned portions of the HSQ layer, according to an embodiment of the invention. FIG. 17A is the cross-section through line A-A' in FIG. 17B.

Referring to FIGS. 17A and 17B, portions of the HSQ layer 210 are exposed using lithography, including but not necessarily limited to, optical lithography, such as, but not necessarily limited to, EUV lithography, or e-beam lithography to cross-link the exposed portions of the HSQ layer 210. For example, if optical lithography is used, parts of the HSQ layer 210 are masked using an optical mask, and exposed portions of the HSQ layer 210 are cross-linked to result in the cross-linked portions 230. If e-beam lithography is used, a mask is not necessary, and the e-beam can be directed to specific coordinates corresponding to the desired locations of the HSQ layer 210 to be cross-linked to result in the cross-linked portions 230. In accordance with a non-limiting illustrative embodiment, the cross-linked portions 230 can be about 10 nm to about 20 nm wide.

As can be seen in FIGS. 17A and 17B, the exposure, whether optical or e-beam, is able to pass through the VLTC layer 214 to form the cross-linked portions 230 of the HSQ layer 210. According to the illustrative embodiment, the cross-linked portions 230 create a rectangular shaped region including the cross-linked portions 230 as edges and a portion of the HSQ layer 210 that is not cross-linked filling (bounding) the rectangular shaped region. Depending on the desired shape and size of the resulting III-V semiconductor layer, the region may not necessarily be rectangular shaped as shown, but may have a different geometric shape and/or size.

Figure 18A:
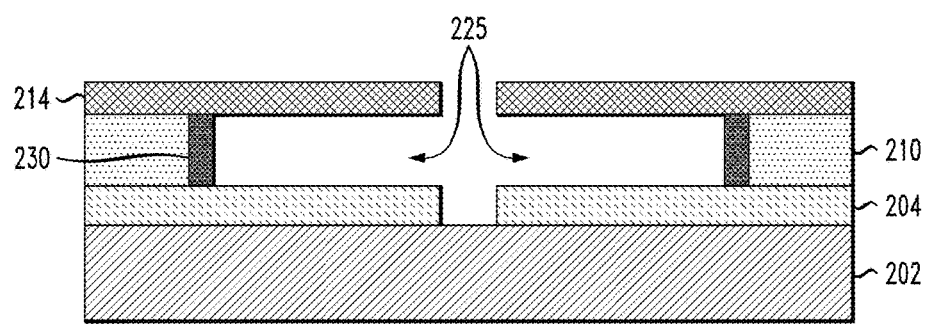
FIGS. 18A and 18B are schematic cross-sectional and top-down views, respectively, illustrating manufacturing of a semiconductor device including a III-V semiconductor material on a dielectric layer and showing developing of portions of the HSQ layer to remove those portions of the HSQ layer, according to an embodiment of the invention.
Figure 18B:
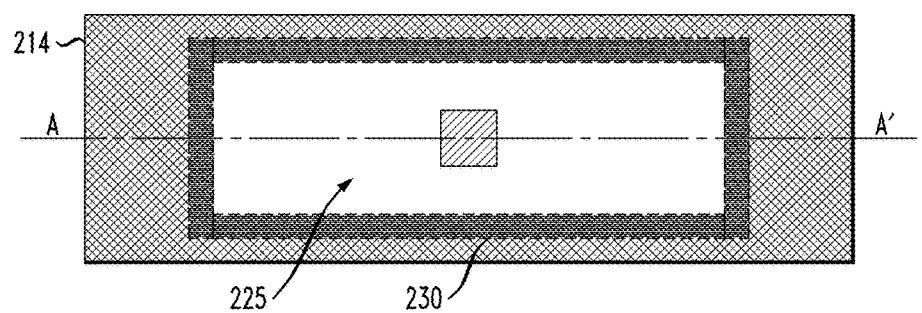

FIGS. 18A and 18B are schematic cross-sectional and top-down views, respectively, illustrating manufacturing of a semiconductor device including a III-V semiconductor material on a dielectric layer and showing developing of portions of the HSQ layer to remove those portions of the HSQ layer, according to an embodiment of the invention. FIG. 18A is the cross-section through line A-A' in FIG. 18B.

Referring to FIGS. 18A and 18B, the portions of the HSQ layer 210 within the rectangular shaped region that have not been cross-linked are developed by a developer including, but not necessarily limited to, a TMAH based solution, or an NaCl+TMAH based solution. The developer is introduced through the via 215 to remove the portions of the HSQ layer 210 within the rectangular shaped region that have not been cross-linked to create a vacant area/cavity 225. The vacant area/cavity 225 is surrounded on sides by the cross-linked portions 230 that remain because the cross-linked portions 230 are not dissolved by the developer. With the exception of the via 215, the VLTC layer 214 borders a top of the vacant area/cavity 225, and the dielectric layer 204 borders a bottom of the vacant area/cavity 225. The portion of the substrate 202 exposed by the via 215 is where epitaxial growth of the III-V semiconductor layer 235 (see FIGS. 19A and 19B) will originate. The developer dissolves the noncross-linked portions 210 within the rectangular shape, but does not dissolve the cross-linked portions 230. The VLTC layer 214, and the cross-linked portions 230 prevent the developer, which is introduced through the via 215, from accessing the portions of the HSQ layer 210 that are outside of the rectangular shape.

Figure 19A:
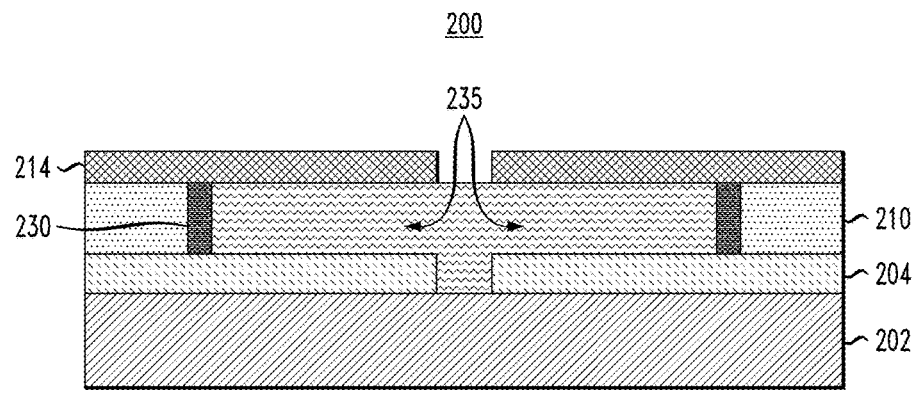
FIGS. 19A and 19B are schematic cross-sectional and top-down views, respectively, illustrating manufacturing of a semiconductor device including a III-V semiconductor material on a dielectric layer and showing epitaxial growth of the III-V semiconductor material, according to an embodiment of the invention.
Figure 19B:
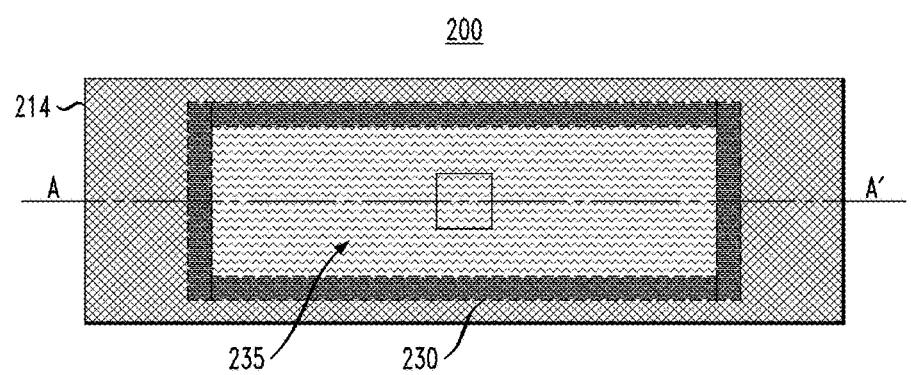

FIGS. 19A and 19B are schematic cross-sectional and top-down views, respectively, illustrating manufacturing of a semiconductor device including a III-V semiconductor material on a dielectric layer and showing epitaxial growth of the III-V semiconductor material, according to an embodiment of the invention. FIG. 19A is the cross-section through line A-A' in FIG. 19B.

Referring to FIGS. 19A and 19B, a III-V semiconductor material 235, including, but not necessarily limited to, InP, is epitaxially grown from the substrate 202 to fill in the vacant area/cavity 225. As noted above when describing epitaxial growth, the semiconductor material being grown (crystalline over layer), which in this case is the III-V material, has substantially the same crystalline characteristics as the semiconductor material of the deposition surface (seed material), which is the material of the substrate 202. In other words, the III-V material 235 is epitaxially registered to the material of the substrate 202, such that the III-V material 235 mimics the crystalline order of the material of the substrate 202 which serves as a template for the growth. The epitaxial growth is selective, so the growth of III-V semiconductor only occurs from a semiconductor surface (in this case, the bottom of the hole 215). With time, overgrowth of the III-V semiconductor 235 propagates over the exposed surfaces of layer 204, and the cavity 225 is filled.

The cavity/vacant area 225 defines the shape of the epitaxially grown III-V material 235 to permit lateral overgrowth (i.e., in left and right directions) of the III-V material 235 on the dielectric layer 204. For example, given the properties of III-V material, the III-V material would not deposit on the dielectric layer 204 itself, and must be epitaxially grown from the underlying substrate 202. Further, the enclosed area/cavity 225 enables the III-V semiconductor material layer 235 to spread out laterally over the dielectric layer 204. The absence of the bounding vacant area/cavity 225, that is, simply growing the III-V semiconductor from an underlying substrate through a hole in an overlying dielectric layer, would result in an unbounded vertical growth of the III-V semiconductor and the lateral overgrowth will not need to take the shape of the cavity 225.

In accordance with an embodiment of the present invention, the wafer including the structure from FIGS. 18A and 18B may be annealed or oxygen plasma treated prior to epitaxial growth in order to harden the cross-linked HSQ 230, since DHF can dissolve cross-linked HSQ and a DHF dip may be required to clean the exposed surface of the semiconductor substrate 202. Such annealing can be done at a temperature of, for example, 900° C., which will convert the HSQ 230 into a high quality $SiO_2$. This will allow the removal of a native oxide at the bottom of the hole 215 without substantially modifying the cavity 225.

Figure 20:
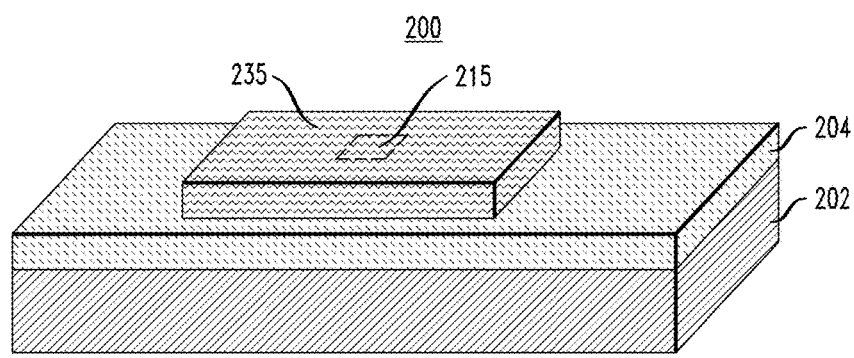
FIG. 20 is a schematic three-dimensional view illustrating the semiconductor device including a III-V semiconductor material on a dielectric layer, according to an embodiment of the invention.

FIG. 20 is a schematic three-dimensional view illustrating the semiconductor device including a III-V semiconductor material on a dielectric layer, according to an embodiment of the invention. Referring to FIG. 20, the laterally expanded III-V semiconductor material layer 235 is shown on the dielectric layer 204, which is on the substrate 202. The dotted line on the top surface of the III-V material layer 235 illustrates the via 215. FIG. 20 shows the substrate with the III-V material after the HSQ material 230, 210 and the cap layer 214 were removed. The III-V material 235 forms a semiconductor on insulator structure, on which a transistor(s) can now be built. Furthermore, a mix III-V and silicon devices can be integrated side by side using this method. The III-V based devices are built on the III-V layer 235, and the silicon based devices on the substrate 202, adjacent to the III-V based devices.

Referring to FIGS. 21A-21D, according to an embodiment of the present invention, the cross-linking and development properties of HSQ can be used to form HSQ spacers on, for example, a gate or other structures. The HSQ spacers can be formed without using an etching process, such as, for example, reactive ion etching (RIE), and instead using lithography and development processes.

Figure 21B:
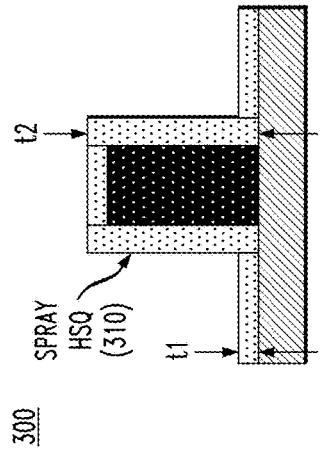
FIG. 21B is a schematic cross-sectional view illustrating forming of HSQ layers on the gate structure and the substrate, according to an embodiment of the invention.
Figure 21D:
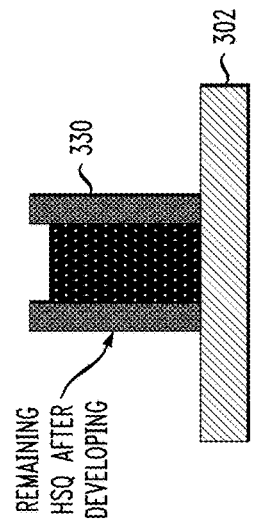
FIG. 21D is a schematic cross-sectional view illustrating a portion of the HSQ layers which remains after development of the HSQ layers, according to an embodiment of the invention.
Figure 21A:
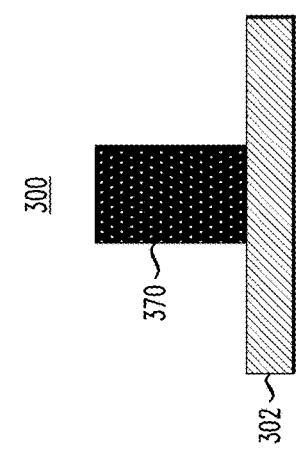
FIG. 21A is a schematic cross-sectional view illustrating a gate structure on a substrate, according to an embodiment of the invention.

By way of a non-limiting illustrative example, FIG. 21A shows a schematic cross-sectional view illustrating a gate structure 370 on a substrate 302, according to an embodiment of the invention. The gate structure can be, for example, a gate structure of a transistor as described herein on a semiconductor substrate 302.

FIG. 21B is a schematic cross-sectional view illustrating forming of HSQ layers on the gate structure and the substrate, according to an embodiment of the invention. Referring to FIG. 21B, HSQ layers 310 are conformally spray coated on to the surface of the substrate 302, and on lateral and top sides of the gate structure 370. The portions of the HSQ layers 310 on the horizontal surfaces are thinner than the portions of the HSQ layers 310 on the vertical surfaces. For example, referring to FIG. 21B, the thickness t1 (between the arrows) of the portions of the HSQ layers 310 on the horizontal surfaces is less than the thickness t2 (between the arrows) of the portions of the HSQ layers 310 on the vertical surfaces.

Because low dose e-beam exposure of HSQ can cross-link thicker layers of HSQ, while not cross-linking thinner layers of HSQ, the difference in thickness between t1 and t2 is able to be used to remove the thinner layers on the horizontal portions, while maintaining the thicker layers on the vertical sides of the gate structure. More electrons per unit volume (a higher e-beam dose) are required to cross-link a thinner HSQ layer than a thicker HSQ layer. Less electrons per unit volume (a lower e-beam dose) cross-links the thicker HSQ layer and not the thinner HSQ layer. In an illustrative non-limiting example, the thickness t1 is about 10 nm, and the thickness t2 is about 100 nm.

Figure 21C:
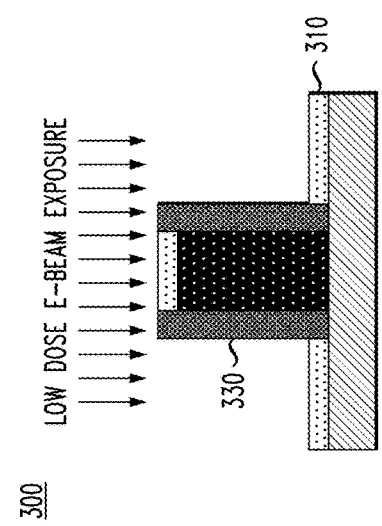
FIG. 21C is a schematic cross-sectional view illustrating low dose e-beam exposure to cross-link a portion of the HSQ layers, according to an embodiment of the invention.

FIG. 21C is a schematic cross-sectional view illustrating low dose e-beam exposure to cross-link a portion of the HSQ layers, according to an embodiment of the invention. Referring to FIG. 21C, the low dose e-beam exposure cross-links the thicker HSQ layers 310 on the vertical surfaces (thickness t2) to result in cross-linked portions 330, while the thinner HSQ layers 310 on the horizontal surfaces (thickness t1) are not cross-linked. In an illustrative non-limiting example, the low dose is about 800 μC (micro Coulomb). If the dose does not exceed a given threshold based on the thicknesses of the HSQ layers, the dose will only cross-link the thicker HSQ layers, and not cross-link the thinner HSQ layers. Accordingly, a low dose is used which is enough to cross-link the thicker HSQ layers, but not enough to cross-link the thinner HSQ layers.

FIG. 21D is a schematic cross-sectional view illustrating a portion of the HSQ layers which remains after development of the HSQ layers, according to an embodiment of the invention. Referring to FIG. 21D, the HSQ layers 310 that have not been cross-linked are developed by a developer including, but not necessarily limited to, a TMAH based solution, or an NaCl+TMAH based solution. The developer is able to dissolve and thereby remove the horizontal portions of the HSQ layer 310 that have not been cross-linked. The cross-linked vertical portions 330 remain, which can function as spacers on a gate structure 370.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of manufacturing a semiconductor device, comprising:
   forming a hydrogen silesquioxane (HSQ) layer on a semiconductor substrate;
   forming a cap layer on the HSQ layer;
   cross-linking a portion of the HSQ layer under the cap layer;
   removing another portion of the HSQ layer which was not cross-linked;
   forming a dielectric layer on the substrate, wherein the dielectric layer is positioned between the HSQ layer and the semiconductor substrate;
   forming at least one opening exposing a portion of the semiconductor substrate through the cap layer, HSQ layer and dielectric layer; and
   epitaxially growing a III-V semiconductor material from the exposed portion of the semiconductor substrate, wherein the III-V semiconductor material occupies a vacant area left by the removal of the other portion of the HSQ layer was not cross-linked;
   wherein the removing comprises introducing a developer through the at least one opening to remove the other portion of the HSQ layer which was not cross-linked.

2. The method according to claim 1, wherein the cross-linking is performed using one of optical lithography and electron beam (e-beam) lithography.

3. The method according to claim 1, wherein the cap layer comprises at least one of aluminum oxide, a low-temperature oxide, a low-temperature nitride, spin-on glass (SOG) and silicon anti-reflective coating (SiARC).

4. The method according to claim 1, wherein the cap layer is deposited on the HSQ layer at a temperature which is less than a threshold temperature for cross-linking the HSQ layer.

5. The method according to claim 1, wherein:
   the vacant area is bordered by the cross-linked portion of the HSQ layer under the cap layer.

6. The method according to claim 1, further comprising forming another HSQ layer on the cap layer.

7. The method according to claim 6, wherein the cross-linking comprises performing an exposure process, wherein a portion of the other HSQ layer on the cap layer is cross-linked during the exposure process with the portion of the HSQ layer under the cap layer.

8. The method according to claim 7, wherein the portion of the other HSQ layer on the cap layer is aligned with the portion of the HSQ layer under the cap layer.

9. A method of manufacturing a semiconductor device, comprising:
   forming a hydrogen silesquioxane (HSQ) layer on a semiconductor substrate;
   forming a cap layer on the HSQ layer;
   cross-linking a portion of the HSQ layer under the cap layer;
   removing another portion of the HSQ layer which was not cross-linked;
   forming a dielectric layer on the substrate, wherein the dielectric layer is positioned between the HSQ layer and the semiconductor substrate;
   forming at least one opening exposing a portion of the semiconductor substrate through the cap layer, HSQ layer and dielectric layer;
   wherein:
     the removing comprises introducing a developer through the at least one opening to remove the other portion of the HSQ layer which was not cross-linked;
     a vacant area is left by the removal of the other portion of the HSQ layer layer which was not cross-linked;
     the vacant area is bordered by the cross-linked portion of the HSQ layer under the cap layer;
     the vacant area is further bordered by the cap layer on a top portion of the vacant area; and
   epitaxially growing a III-V semiconductor material from the exposed portion of the substrate in the vacant area.

* * * * *